(12) United States Patent
Kwak et al.

(10) Patent No.: US 6,256,254 B1
(45) Date of Patent: Jul. 3, 2001

(54) SEMICONDUCTOR MEMORY DEVICE DECODER

(75) Inventors: Choong-Keun Kwak; Sang-Jib Han, both of Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/564,593

(22) Filed: May 3, 2000

(30) Foreign Application Priority Data

May 3, 1999 (KR) .................................................. 99-15848

(51) Int. Cl.$^7$ ....................................................... G11C 8/00
(52) U.S. Cl. .................................. 365/230.03; 365/233.5; 365/230.06
(58) Field of Search ............................ 365/233.5, 230.03, 365/230.06

(56) References Cited

U.S. PATENT DOCUMENTS 5,625,595 * 4/1997 Ikeda ..................................... 365/194
5,694,370 * 12/1997 Yoon .

* cited by examiner

Primary Examiner—A. Zarabian
(74) Attorney, Agent, or Firm—Marger Johnson & McCollum, P.C.

(57) ABSTRACT

A semiconductor memory device includes a plurality of memory cell array blocks, an address transition detecting pulse generator to generate address transition detecting pulse signals by detecting the transition of a plurality of addresses, a global row decoder having a plurality of groups of pre-decoders and a main decoder to generate a plurality of global word line signals of a plurality of memory cell array blocks by decoding the plurality of addresses, and a plurality of block row decoders having a plurality of decoding cells to respond to block control signals for selecting a plurality of memory cell array blocks and a plurality of pulse control signals combined with the address transition detecting pulse signals to output a plurality of global word line signals generated by the global row decoder as a plurality of local word line signals. A plurality of the decoding cells of a plurality of the block row decoders comprises switching transistors or other means to switch the global word line signals into local word line signals in response to a first state of the pulse control signals, and inactive means, e.g. one or more transistors, to put the local word line signals into its inactive state in response to a second state of the pulse control signals, thereby reducing the number of transistors to make up of the decoder for efficient layout.

14 Claims, 13 Drawing Sheets

SEMICONDUCTOR MEMORY DEVICE DECODER

BACKGROUND OF THE INVENTION

The present invention relates to a semiconductor memory device, and more particularly to a semiconductor memory device and a decoder therein to reduce the number of transistors that make up the decoder, and to reduce the layout area of the decoder positioned between memory cell blocks.

In general, the semiconductor memory device is constructed to store data at memory cell arrays made up of a plurality of memory cells. In order to select one out of a plurality of memory cells, a block row decoder decodes a row address to pick one out of a plurality of word lines and a column decoder decodes a column address to select one out of a plurality of bit lines corresponding with the selected memory cell.

The decoder of a conventional semiconductor memory device uses NAND gates and inverters to decode addresses. If the capacity of the semiconductor memory device increases, the number of addresses also increases, further increasing the number of NAND gates and inverters that make up the decoder.

Particularly, a block row decoder of the conventional semiconductor memory device is positioned between blocks of memory cell arrays. As the number of memory cells (and thus word lines) increases, the number of transistors that make up the block row decoder also increases.

The conventional block row decoder is made up of a NAND gate and an inverter to perform an AND operation with a block control signal and a global word line signal, to thereby output a local word line signal.

Particularly, as the integration degree of memory cell array blocks increases, the space or interval between blocks of the memory cell arrays is reduced. As the number of word lines increases, it gets more and more difficult to realize memory cell arrays.

In consequence, there is a problem in the conventional decoder of the semiconductor memory device in that the structure of the decoder gets complicated to bring about difficulty in layout of memory cell array blocks with a narrow interval therebetween.

FIG. 1 is a block diagram for illustrating arrangement of a conventional memory device, including n memory cell array blocks MCAB1, MCAB2, . . . , MCABn, a global row decoder GRD and n block row decoders BRD1, BRD2, . . . , BRDn positioned between n memory cell array blocks.

The global row decoder GRD inputs i row addresses Ai to generate k global word line signals GWL1, GWL2, GWL3, . . . , GWLk. The n block row decoders respectively respond to block control signals B1, B2, . . . Bn to convert the global word line signals into local word line signals LWL1, LWL2, . . . , LWLk which are, then, transmitted to memory cell array blocks MCA1, MCA2, . . . , MCABn.

FIG. 2 is a block diagram for illustrating an embodiment of a block row decoder of a conventional semiconductor memory device, which shows the structure of the row address decoder in case that four addresses XA1, XA2, XA3, XA4 are inputted from outside the memory device.

The decoder shown in FIG. 2 includes buffers 10-1, 10-2, 10-3, 10-4, global row decoders GRD having pre-decoders PRD1, PRD2 and a main decoder DE, and a block row decoder BRD.

The buffers 10-1, 10-2, 10-3, 10-4 respectively buffer the addresses XA1, XA2, XA3, XA4 inputted from outside of the semiconductor memory device to respectively generate buffered addresses (A1, A1B), (A2, A2B), (A3, A3B), (A4, A4B). The pre-decoder PRD1 decodes the signals inputted from the buffers 10-1, 10-2 to generate decoded output signals d1, d2, d3, d4. The pre-decoder PRD2 decodes the signals inputted from the buffers 10-3, 10-4 to generate decoded output signals d5, d6, d7, d8. The decoder DE inputs the output signals d1, d2, d3, d4, d5, d6, d7, d8 of the pre-decoders PRD1, PRD2 to generate global word line signals GWL1, GWL2, . . . , GWL16. The block row decoder BRD responds to a block control signal Bn to respectively convert global word line signals GWL1, GWL2, . . . , GWL16 into local word line signals LWL1, LWL2, . . . , LWL16.

FIG. 3 is a circuit diagram for illustrating an embodiment of the global row decoder GRD and the block row decoder BRD of the block diagram shown in FIG. 2. The pre-decoder PRD1 is constructed with decoding cells 20-1, 20-2, 20-3, 20-4 having NAND gates NA and inverters I for respectively ANDing pairs of buffered addresses (A1B, A2B), (A1B, A2), (A1, A2B), (A1, A2) to respectively generate output signals d1, d2, d3, d4. The pre-decoder PRD2 is constructed with decoding cells 20-5, 20-6, 20-7, 20-8 having NAND gates NA and inverters I for respectively ANDing pairs of buffered addresses (A3B, A4B), (A3B, A4), (A3, A4B), (A3, A4) to respectively generate output signals d5, d6, d7, d8.

The main decoder DE includes decoding cells 30-1, 30-2, 30-3, 30-4, . . . , 30-13, 30-14, 30-15, 30-16 having NAND gates and inverters I for respectively ANDing pairs of decoded output signals (d1, d5), (d1, d6), (d1, d7), (d1, d8), . . . , (d4, d5), (d4, d6), (d4, d7 pre-decoders PRD1, PRD2 to respectively generate 16 global word line signals GWL1, GWL2, GWL3, GWL4, . . . , GWL13, GWL14, GWL15, GWL16. The block row decoder BRD is constructed with decoding cells 40-1, 40-2, . . . , 40-16 having NAND gates NA and inverters I for respectively ANDing the global word line signals GWL1, GWL2, . . . , GWL16 outputted from the main decoder DE with the block control signal Bn to respectively generate 16 local word line signals LWL1, LWL2, . . . , LWL16.

The decoder described above performs operations in the following Table.

TABLE

| A1 | A2 | A3 | A4 | d1 | d2 | d3 | d4 | d5 | d6 | d7 | d8 | GWL1 | GWL2 | GWL3 | GWL4 | GWL5 | GWL6 | GWL7 | GWL8 | GWL9 | GWL10 | GWL11 | GWL12 | GWL13 | GWL14 | GWL15 | GWL16 |
|----|----|----|----|----|----|----|----|----|----|----|----|------|------|------|------|------|------|------|------|------|-------|-------|-------|-------|-------|-------|-------|
| 0 | 0 | 0 | 0 | 1 | 0 | 0 | 0 | 1 | 0 | 0 | 0 | 1 | 0 | 0 | 0 | 0 | 0 | 0 | 0 | 0 | 0 | 0 | 0 | 0 | 0 | 0 | 0 |
| 0 | 0 | 0 | 1 | 1 | 0 | 0 | 0 | 0 | 1 | 0 | 0 | 0 | 1 | 0 | 0 | 0 | 0 | 0 | 0 | 0 | 0 | 0 | 0 | 0 | 0 | 0 | 0 |

TABLE-continued

| A1 | A2 | A3 | A4 | d1 | d2 | d3 | d4 | d5 | d6 | d7 | d8 | GWL1 | GWL2 | GWL3 | GWL4 | GWL5 | GWL6 | GWL7 | GWL8 | GWL9 | GWL10 | GWL11 | GWL12 | GWL13 | GWL14 | GWL15 | GWL16 |
|---|---|---|---|---|---|---|---|---|---|---|---|---|---|---|---|---|---|---|---|---|---|---|---|---|---|---|---|
| 0 | 0 | 1 | 0 | 1 | 0 | 0 | 0 | 0 | 0 | 1 | 0 | 0 | 0 | 1 | 0 | 0 | 0 | 0 | 0 | 0 | 0 | 0 | 0 | 0 | 0 | 0 | 0 |
| 0 | 0 | 1 | 1 | 1 | 0 | 0 | 0 | 0 | 0 | 0 | 1 | 0 | 0 | 0 | 1 | 0 | 0 | 0 | 0 | 0 | 0 | 0 | 0 | 0 | 0 | 0 | 0 |
| 0 | 1 | 0 | 0 | 0 | 1 | 0 | 0 | 1 | 0 | 0 | 0 | 0 | 0 | 0 | 0 | 1 | 0 | 0 | 0 | 0 | 0 | 0 | 0 | 0 | 0 | 0 | 0 |
| 0 | 1 | 0 | 1 | 0 | 1 | 0 | 0 | 0 | 1 | 0 | 0 | 0 | 0 | 0 | 0 | 0 | 1 | 0 | 0 | 0 | 0 | 0 | 0 | 0 | 0 | 0 | 0 |
| 0 | 1 | 1 | 0 | 0 | 1 | 0 | 0 | 0 | 0 | 1 | 0 | 0 | 0 | 0 | 0 | 0 | 0 | 1 | 0 | 0 | 0 | 0 | 0 | 0 | 0 | 0 | 0 |
| 0 | 1 | 1 | 1 | 0 | 1 | 0 | 0 | 0 | 0 | 0 | 1 | 0 | 0 | 0 | 0 | 0 | 0 | 0 | 1 | 0 | 0 | 0 | 0 | 0 | 0 | 0 | 0 |
| 1 | 0 | 0 | 0 | 0 | 0 | 1 | 0 | 1 | 0 | 0 | 0 | 0 | 0 | 0 | 0 | 0 | 0 | 0 | 0 | 1 | 0 | 0 | 0 | 0 | 0 | 0 | 0 |
| 1 | 0 | 0 | 1 | 0 | 0 | 1 | 0 | 0 | 1 | 0 | 0 | 0 | 0 | 0 | 0 | 0 | 0 | 0 | 0 | 0 | 1 | 0 | 0 | 0 | 0 | 0 | 0 |
| 1 | 0 | 1 | 0 | 0 | 0 | 1 | 0 | 0 | 0 | 1 | 0 | 0 | 0 | 0 | 0 | 0 | 0 | 0 | 0 | 0 | 0 | 1 | 0 | 0 | 0 | 0 | 0 |
| 1 | 0 | 1 | 1 | 0 | 0 | 1 | 0 | 0 | 0 | 0 | 1 | 0 | 0 | 0 | 0 | 0 | 0 | 0 | 0 | 0 | 0 | 0 | 1 | 0 | 0 | 0 | 0 |
| 1 | 1 | 0 | 0 | 0 | 0 | 0 | 1 | 1 | 0 | 0 | 0 | 0 | 0 | 0 | 0 | 0 | 0 | 0 | 0 | 0 | 0 | 0 | 0 | 1 | 0 | 0 | 0 |
| 1 | 1 | 0 | 1 | 0 | 0 | 0 | 1 | 0 | 1 | 0 | 0 | 0 | 0 | 0 | 0 | 0 | 0 | 0 | 0 | 0 | 0 | 0 | 0 | 0 | 1 | 0 | 0 |
| 1 | 1 | 1 | 0 | 0 | 0 | 0 | 1 | 0 | 0 | 1 | 0 | 0 | 0 | 0 | 0 | 0 | 0 | 0 | 0 | 0 | 0 | 0 | 0 | 0 | 0 | 1 | 0 |
| 1 | 1 | 1 | 1 | 0 | 0 | 0 | 1 | 0 | 0 | 0 | 1 | 0 | 0 | 0 | 0 | 0 | 0 | 0 | 0 | 0 | 0 | 0 | 0 | 0 | 0 | 0 | 1 |

The decoder of the conventional semiconductor memory device thus constructed increases the number of addresses in accordance with increasing the capacity of memory cell arrays, thereby increasing the number of transistors that make up the decoder.

However, there is a problem in the decoder of the conventional semiconductor memory device in that the increase in the number of the transistors of the row block decoder formed between the blocks of the memory cell arrays reduces layout efficiency and increases the surface area of the chip.

Thus, in order to solve the aforementioned problem of the prior art, a technique is disclosed in U.S. Pat. No. 5,808,500, wherein the block row decoder positioned between blocks of memory cell arrays is constructed with transmission gates to transmit global word line signals to local word lines in response to the block control signals and a clamp circuit to put the local word lines into their inactive states in response to the block control signals. In other words, the number of transistors that make up the block row decoder is reduced for a more efficient layout.

The technique disclosed in U.S. Pat. No. 5, 808,500 has been successful in modestly reducing the number of transistors that make up the block row decoder. However, there is still a problem in the aforementioned technique in that the number of transistors that make up the global row decoder could not be reduced. Consequently, the disclosed technique failed to significantly reduce the number of total transistors that make up the overall decoder requirements in a semiconductor memory device.

SUMMARY OF THE INVENTION

Therefore, it is an object of the present invention to improve the layout efficiency of a semiconductor memory device by reducing the number of transistors that make up the block row decoder or the global row decoder, or both, to thereby greatly reduce the overall transistor count within one or more decoders.

It is another object of the present invention to provide a decoder of a semiconductor memory device which can reduce the number of transistors that make up the decoder.

In order to accomplish the aforementioned objects of the present invention, there is provided a semiconductor memory device comprising: a plurality of memory cell array blocks; an address transition detecting pulse generator to generate address transition detecting pulse signals by detecting the transition of a plurality of addresses; a global row decoder having a plurality of groups of pre-decoders and a main decoder to generate a plurality of global word line signals of a plurality of memory cell array blocks by decoding a plurality of addresses; and a plurality of block row decoders having a plurality of decoding cells to respond to block control signals to select a plurality of memory cell array blocks and a plurality of pulse control signals combined with the address transition detecting pulse signals to output a plurality of global word line signals output from the global row decoder as a plurality of local word line signals, wherein a plurality of the decoding cells of a plurality of the block row decoders comprises: switching means to switch the global word line signal into a local word line signal in response to a first state of the pulse control signal; and inactive means to put the local word line signal into its inactive state in response to a second state of the pulse control signal.

Another way of describing the invention is as a semiconductor memory device comprising: a plurality of memory cell array blocks; an address transition detecting pulse generator to generate address transition detecting pulse signals by detecting the transition of a plurality of addresses; a global row decoder having a plurality of groups of pre-decoders and a main decoder with a plurality of decoding cells to generate a plurality of global word line signals to control a plurality of control word lines of a plurality of memory cell array blocks by decoding a plurality of addresses and responding to the address transition detecting pulse signals; and a plurality of block row decoders having a plurality of decoding cells to respond to the block control signals to select a plurality of memory cell array blocks to output a plurality of global word line signals generated by the global row decoder as a plurality of local word line signals, wherein a plurality of decoding cells of a plurality of groups of the pre-decoders and the main decoder of the global row decoders comprises: a plurality of switching means chain-connected between an input terminal to input one decoding output signal of a prior group of pre-decoders and a decoding output signal generating terminal having control electrodes to input the other decoding output signals of the prior group of pre-decoders and the address transition detecting pulse signals; and inactive means connected to the decoding output signal generating terminal to put the decoding output signal generating terminal into its inactive state in response to the address transition detecting pulse signals.

In order to accomplish the other object of the present invention, there is provided a decoder of a semiconductor memory device comprising: an address transition detecting pulse signal generating unit to generate address transition detecting pulse signals by detecting the transition of a plurality of input signals; and a decoder having a plurality of groups of pre-decoders and a main decoder with a plurality of decoding cells to generate a plurality of decoding output signals by decoding a plurality of input signals and responding to the address transition detecting pulse signals, wherein a plurality of decoding cells of at least one group of the pre-decoders out of a plurality of groups of pre-decoders comprise: a plurality of switching transistors or other switching means respectively connected with an input terminal to input decoding output signals of a prior group of the pre-decoders and a decoding output generating terminal, having control electrodes to respectively input other decoding output signals of the prior group of pre-decoders and the address transition detecting pulse signals; and inactive means connected to the decoding output signal generating terminal to put the decoding output signal generating terminal into its inactive state in response to the address transition detecting pulse signals.

BRIEF DESCRIPTIONS OF THE DRAWINGS

DETAILED DESCRIPTIONS OF THE INVENTION

A semiconductor memory device and the decoder therein will be described with reference to accompanying drawings.

Figure 4:
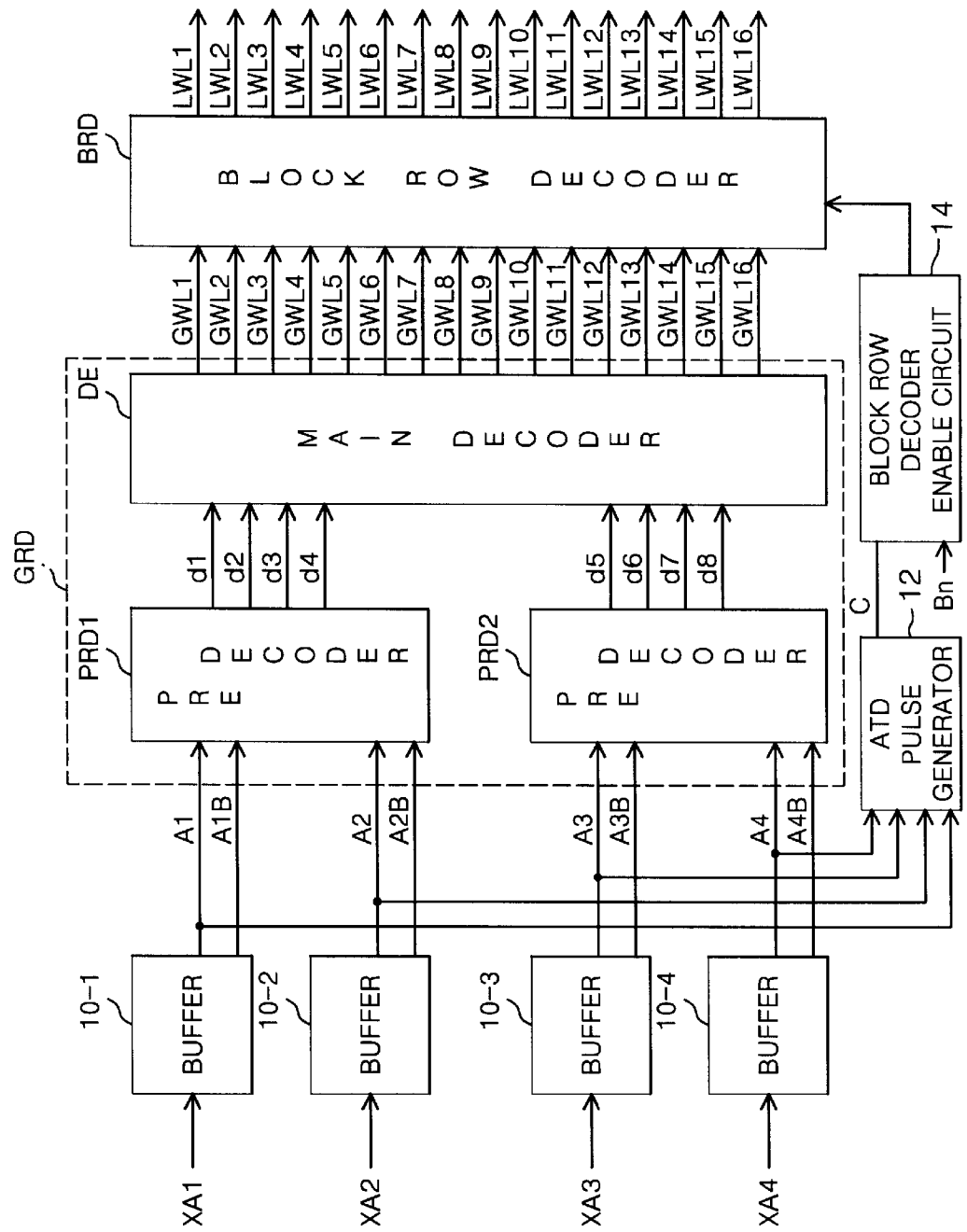
FIG. 4 is a block diagram for illustrating an embodiment of a decoder of a semiconductor memory device of the present invention.

FIG. 4 is a block diagram for illustrating an embodiment of a row block decoder of a semiconductor memory device of the present invention, comprising buffers 10-1, 10-2, 10-3, 10-4, pre-decoders PRD1, PRD2 and a main decoder DE, a block row decoder BRD, an address transition detecting pulse generator 12 and a block row decoder enable circuit 14.

Figure 1:
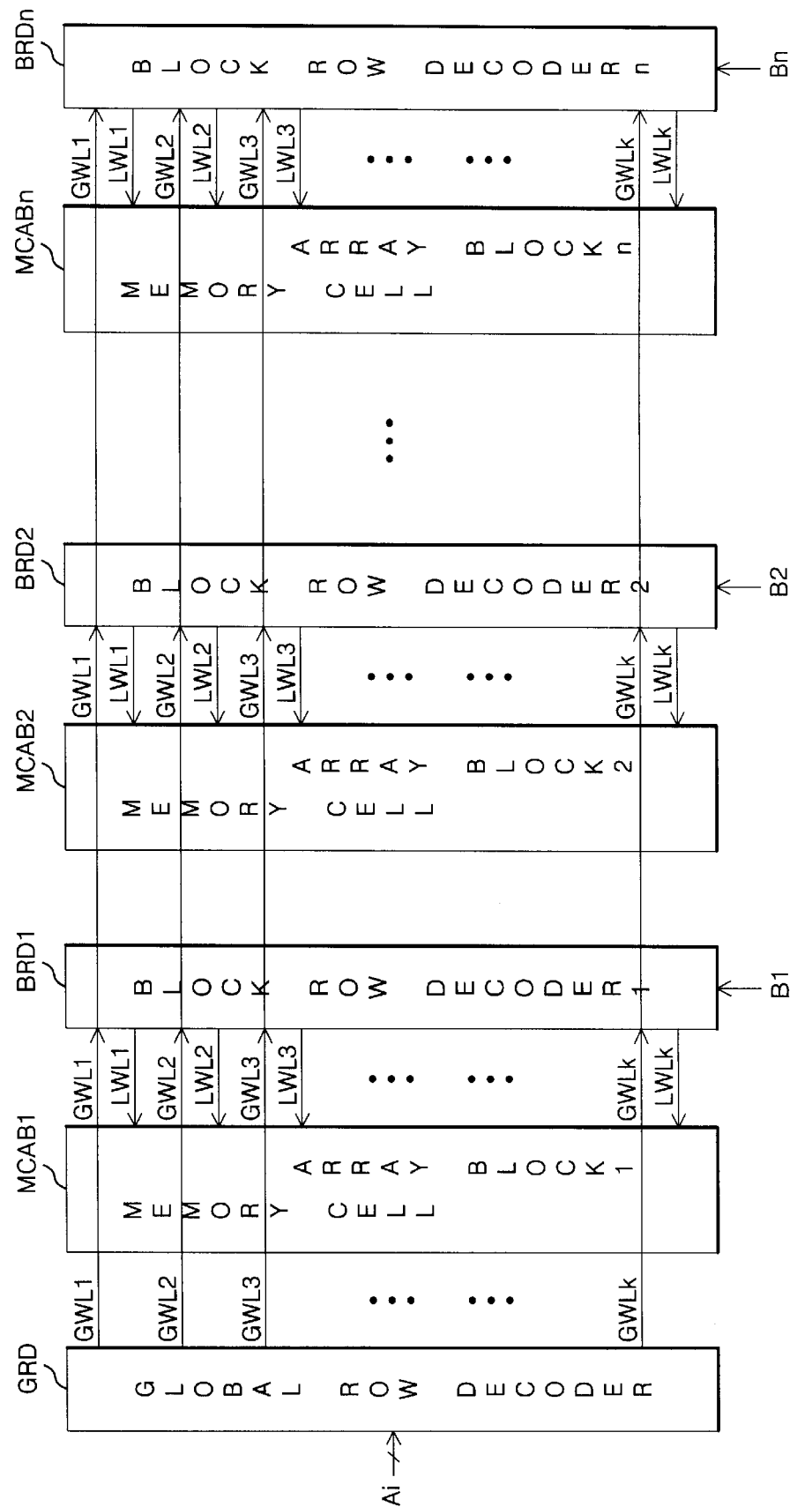
FIG. 1 is a block diagram for illustrating arrangement of a conventional semiconductor memory device.
Figure 2:
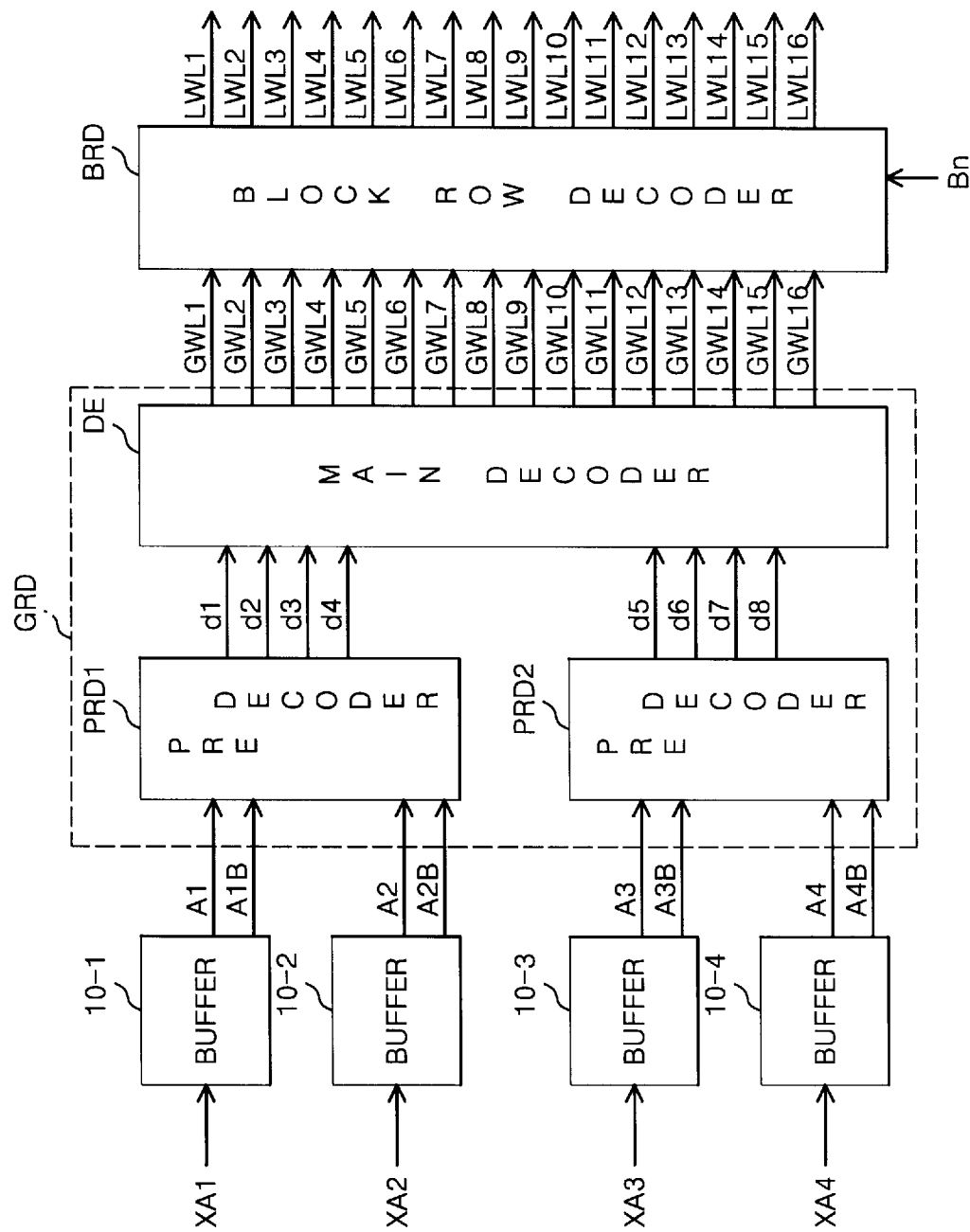
FIG. 2 is a block diagram for illustrating an embodiment of a row block decoder of a conventional semiconductor memory device.

In other words, the address transition detecting pulse generator 12 and the block row decoder enable circuit 14 are additionally assembled to the structure of the conventional decoder shown in FIG. 2.

The address transition detecting pulse generator 12 detects transition of address signals by inputting output signals of the buffers 10-1, 10-2, 10-3, 10-4 to generate a positive-going (high-active) pulse signal (C) having a predetermined period or pulse width. Also, the block row decoder enable circuit 14 combines the positive pulse signal (C) and block control signals Bn to transmit to the block row decoder BRD. Thus, the block row decoder BRD converts the global word line signals GWL1, GWL2, ..., GWL16 to local word line signals LWL1, LWL2, ..., LWL16 during the period of the address transition detecting pulse C.

Figure 5:
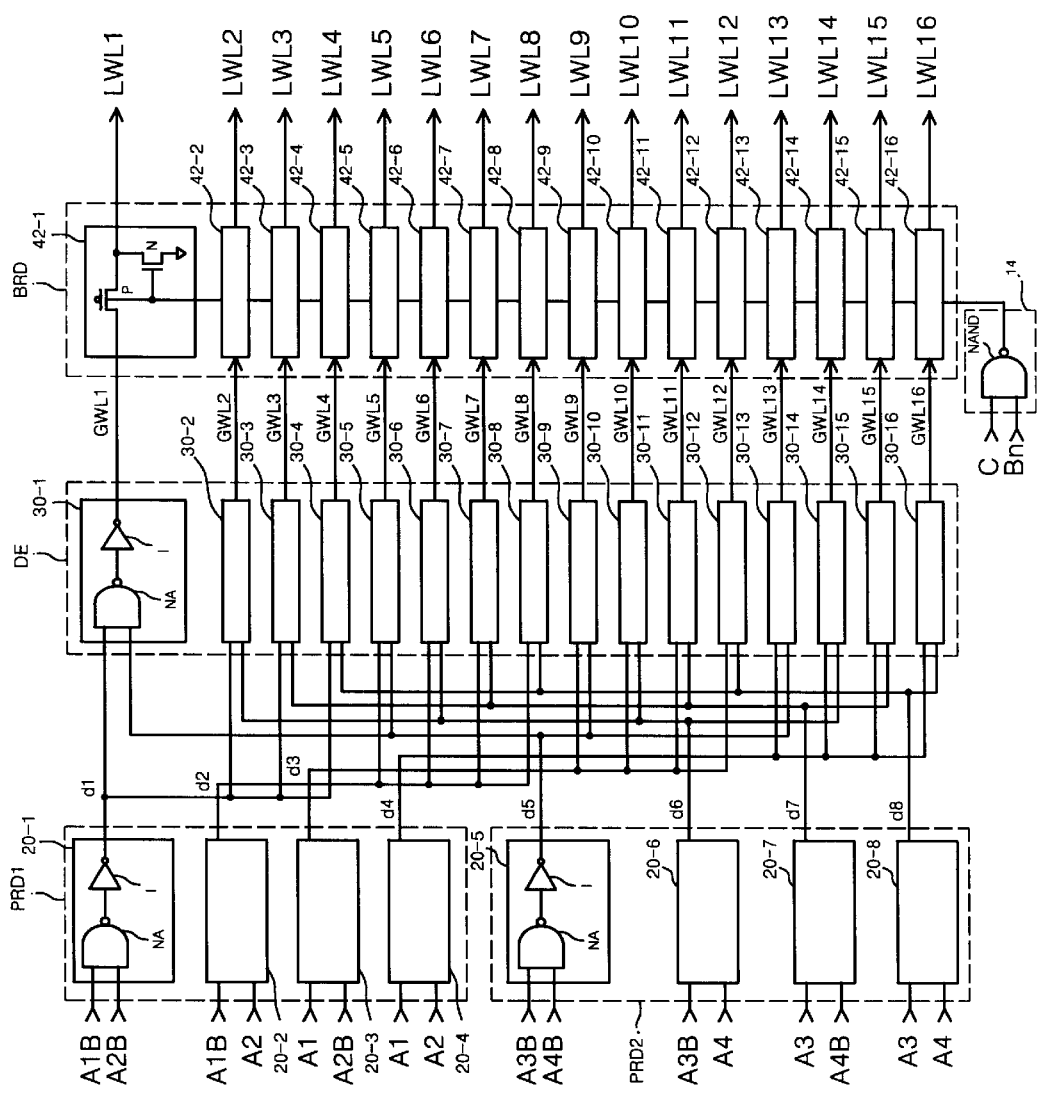
FIG. 5 is a circuit diagram for illustrating an embodiment of the block diagram shown in FIG. 4.

FIG. 5 is a circuit diagram for illustrating an embodiment of the block diagram shown in FIG. 4. The pre-decoders PRD1, PRD2 and the main decoder DE are constructed in the same circuit structure of the decoder shown in FIG. 3. The block row decoder enable circuit 14 is constructed with NAND gates NAND to perform NAND operations with the positive pulse signal (C) and the block control signals Bn. The block row decoder BRD is constructed with decoding cells 42-1, 42-2, ..., 42-16 having PMOS transistors P and NMOS transistors N to respectively output the 16 global word line signals GWL1, GWL2, ..., GWL16 outputted from the main decoder DE as 16 local word line signals LWL1, LWL2, ..., LWL16 in response to output signals of the NAND gate NAND.

Figure 3:
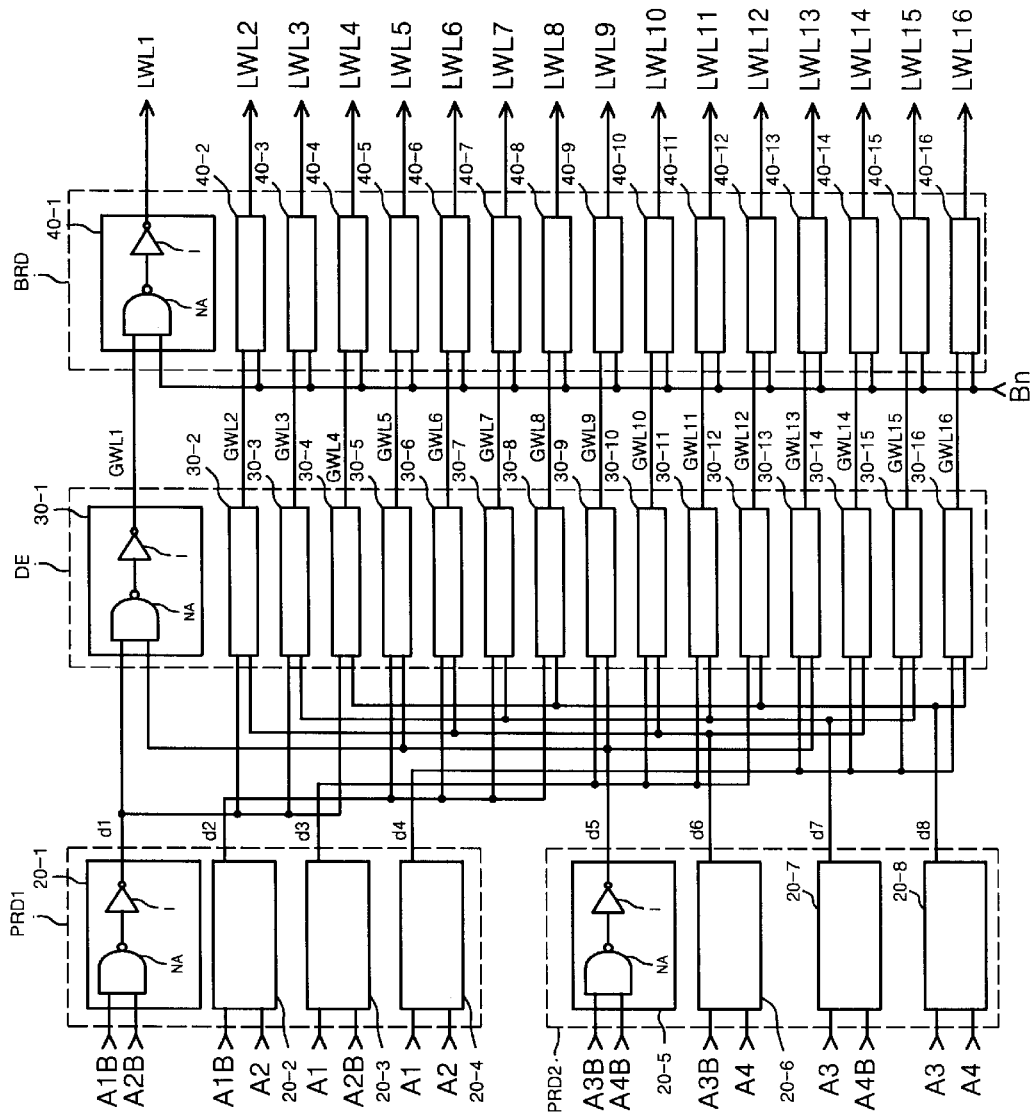
FIG. 3 is a circuit diagram for illustrating an embodiment of a global row decoder and a block row decoder in the block diagram shown in FIG. 2.

The structure and operations of the pre-decoders PRD1, PRD2 and the main decoder DE will be easily understood with reference to descriptions of FIG. 3.

The structure and operations of decoding cells 42-1, 42-2, ..., 42-16 that make up the block row decoder BRD will be described with reference to those of a decoding cell as follows.

Typical decoding cell 42-1 is made of a PMOS transistor P having a source where a global word line signal GWL1 is applied and a gate where an output signal of the NAND gate NAND is applied, and a NMOS transistor N having a drain connected to the drain of the PMOS transistor P, a gate where an output signal of the NAND gate NAND is applied and a source connected to a grounding voltage.

Operations of the decoding cell 42-1 thus constructed will be described as follows.

If the output signal of the NAND gate is at its high level, the NMOS transistor N turns on to generate a low level of a local word line signal LWL1. If the output signal of the NAND gate is at its low level, the PMOS transistor P turns on to output a global word line signal GWL1 as a local word line signal LWL1.

As such operations are performed, the decoding cells 42-1, 42-2, ..., 42-16 output global word line signals GWL1, GWL2, ..., GWL16 as local word line signals LWL1, LWL2, ..., LWL16 during the period of the address transition detecting pulse C.

In other words, the decoder shown in FIG. 5 performs such operations as shown in the Table described above.

Figure 6:
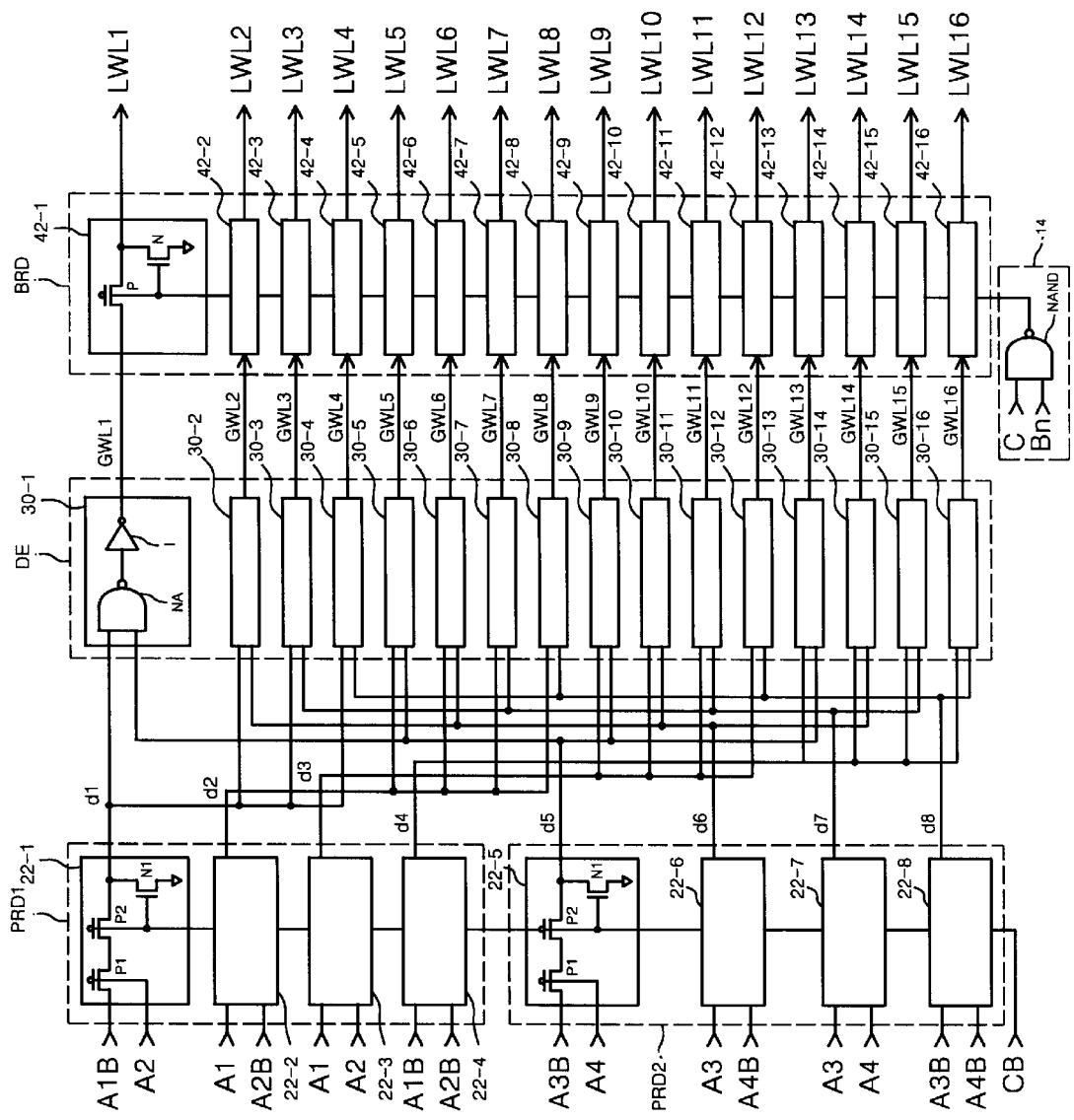
FIG. 6 is a circuit diagram for illustrating another embodiment of the block diagram shown in FIG. 4.

FIG. 6 is a circuit diagram for illustrating another embodiment of the block diagram shown in FIG. 4. The main decoder DE, the block row decoder BRD and the block row decoder enable circuit 14 are constructed in the same structure as shown in FIG. 5. The pre-decoder PRD1 is constructed with decoding cells 22-1, 22-2, 22-3, 22-4 each having PMOS transistors P1, P2 and an NMOS transistor N1 to generate decoding output signals d1, d2, d3, d4, respectively. Decoding cells 22-1, 22-2, 22-3, 22-4 decode pairs of addresses (A1B, A2), (A1, A2B), (A1B, A2B), respectively, buffered by buffers 10-1, 10-2 (refer to FIG. 4). The pre-decoder PRD2 is constructed with decoding cells 22-5, 22-6, 22-7, 22-8 each having PMOS transistors P1, P2 and an NMOS transistor N1 to generate decode output signals d5, d6, d7, d8, respectively. Decoding cells 22-5, 22-6, 22-7, 22-8 decode pairs of addresses (A3B, A4), (A3, A4B), (A3, A4) (A3B, A4B), respectively, buffered by the buffers 10-3, 10-4 (refer to FIG. 4).

The structure and operations of the decoding cells 22-1, 22-2, ..., 22-8 will be described with reference to a typical decoding cell 22-1, as follows.

The decoding cell 22-1 is constructed with a PMOS transistor P1 having a drain where the buffered address A1B is applied and a gate where the buffered address A2 is applied, a PMOS transistor P2 having a source connected to the source of the PMOS transistor P1 and a gate where a pulse signal (CB) is applied, and an NMOS transistor N1 having a drain connected to the drain of the PMOS transistor P2, a gate where a signal (CB) is applied and a source connected to a grounding voltage.

Operations of the decoding cell 22-1 thus constructed will be described below.

The address transition detecting pulse generator 12 (see FIG. 4) generates a positive pulse signal (C) in case of detection of an address transition. The decoding cell generates a decoding output signal d1 in response to a negative pulse signal (CB), a signal that is inverted with respect to the address transition detecting pulse signal (C).

In the decoding cell 22-1, if the pulse signal (CB) is at its high level, the NMOS transistor (N1) turns on to generate a low-level signal on d1. If the pulse signal (CB) is at its low level, it generates a decoding output signal d1 logic that is a logic combination of A1B and A2. If the address A2 is at its high level, the address A1B is not transmitted. If the address A2 is at its low level, the PMOS transistor P1 turns on to transmit the address A1B. In other words, if the address A1B is at its high level, and the address A2 is at its low level, a high level of the address A1B is transmitted to the output d1.

Furthermore, operations of the other decoding cells 22-2, 22-3, ..., 22-8 are the same as those of the decoding cell 22-1.

Therefore, the decoding cells 22-1, 22-2, ..., 22-8 respectively generate decoding output signals d1, d2, d3, d4, d5, d6, d7, d8 in the Table above.

Figure 7:
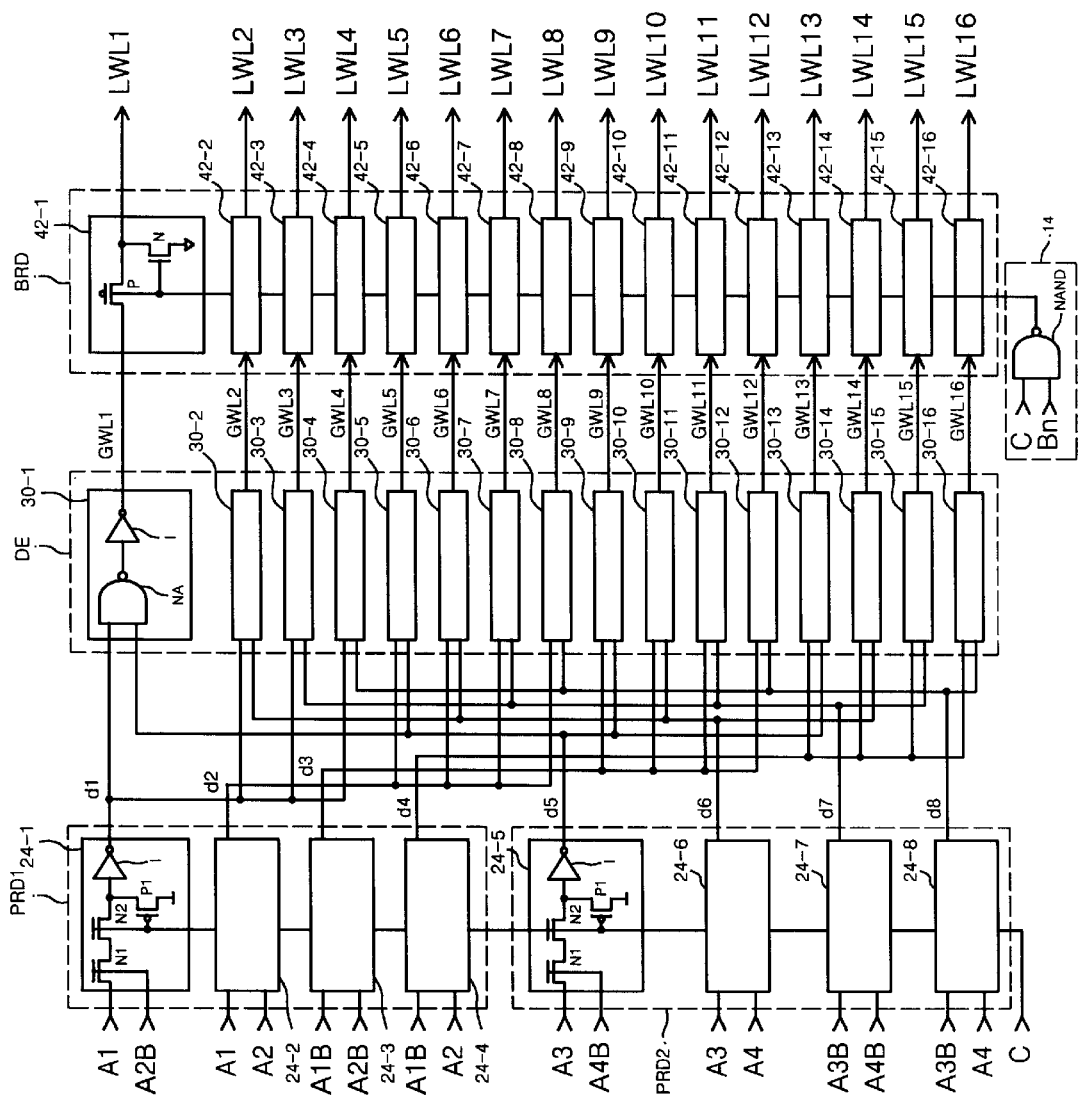
FIG. 7 is a circuit diagram for illustrating the other embodiment of the block diagram shown in FIG. 4.

FIG. 7 is a circuit diagram of another embodiment of the block diagram shown in FIG. 4. The structure of the main decoder DE, the block row decoder BRD and the block row decoder enable circuit 14 is the same as shown in FIG. 6. The pre-decoder PRD1 is constructed with decoding cells 24-1, 24-2, 24-3, 24-4 having NMOS transistors N1, N2 and PMOS transistor P1 to respectively decode the pairs of addresses (A1, A2B), (A1, A2), (A1B, A2B), (A1B, A2) buffered by the buffers 10-1, 10-2 (see FIG. 4) to thereby generate decoding output signals d1, d2, d3, d4. The pre-decoder PRD2 is constructed with decoding cells 24-5, 24-6, 24-7, 24-8 having NMOS transistors N1, N2 and PMOS transistor P1 to respectively decode the pairs of addresses (A3, A4B), (A3, A4), (A3B, A4B), (A3B, A4) buffered by the buffers 10-3, 10-4 (see FIG. 4) to thereby generate decoding output signals d5, d6, d7, d8.

The structure and operations of the main decoder DE and the block row decoder BRD can be easily understood with reference to descriptions of FIGS. 3 and 5, respectively.

The structure and operations of the decoding cells 24-1, 24-2, ..., 24-8 that make up pre-decoders PRD1, PRD2 will be described in terms of a typical decoding cell 24-1, as follows.

The decoding cell 24-1 is constructed with an NMOS transistor N1 having a drain where an address A1 is applied, and a gate where an address A2B is applied. Decoding cell 24-1 also includes another NMOS transistor N2 having a source connected to the source of the NMOS transistor N1 and a gate where an address transition detecting pulse signal (C) is applied, a PMOS P1 having a drain connected to the drain of the NMOS transistor N2 and a source where a supply voltage is applied, and an inverter I to invert the signal output from the drain of the PMOS transistor P1.

The operations of the decoding cell 24-1 thus constructed will be described as follows.

In the decoding cell 24-1, if the pulse signal (C) is at its low level, the PMOS transistor (P1) turns on to generate a high-level signal at the input to an inverter I. If the pulse signal (C) is at its high level, P1 enables a decoding output signal d1. If the address A2B is at its low level, the address A1 is not transmitted. If the address A2B is at its high level, the NMOS transistor N1 turns on to transmit the address A1. In other words, if the address A2B is at its high level, the address A1 is at its low level, a low level of the address A1 is transmitted. The inverter I inverts the signal passed at the drain of the PMOS transistor P1 to the decoding output signal d1.

Furthermore, operations of the other decoding cells 24-2, 24-3, ..., 24-8 are the same as those of the decoding cell 24-1.

Thus, the decoding cells 24-1, 24-2, ..., 24-8 respectively generate decoding output signals d1, d2, ... d8 in the Table above.

As shown in FIGS. 5 through 7, the decoding cells that make up the block row decoder BRD are each constructed with one PMOS transistor and one NMOS transistor, thereby reducing the number of transistors, which improves the efficiency of the layout of the block row decoder positioned between blocks of the memory cell arrays.

As shown in FIGS. 6 and 7, the pre-decoders PRD1, PRD2 that make up the global row decoder are each constructed with two PMOS transistors and one NMOS transistor (FIG. 6), or two NMOS transistors, one PMOS transistor and an inverter (FIG. 7), thereby reducing the number of transistors.

Therefore, reduction in the total number of the transistors to make up of the decoder of the semiconductor memory device results in increase in the layout efficiency.

Figure 8:
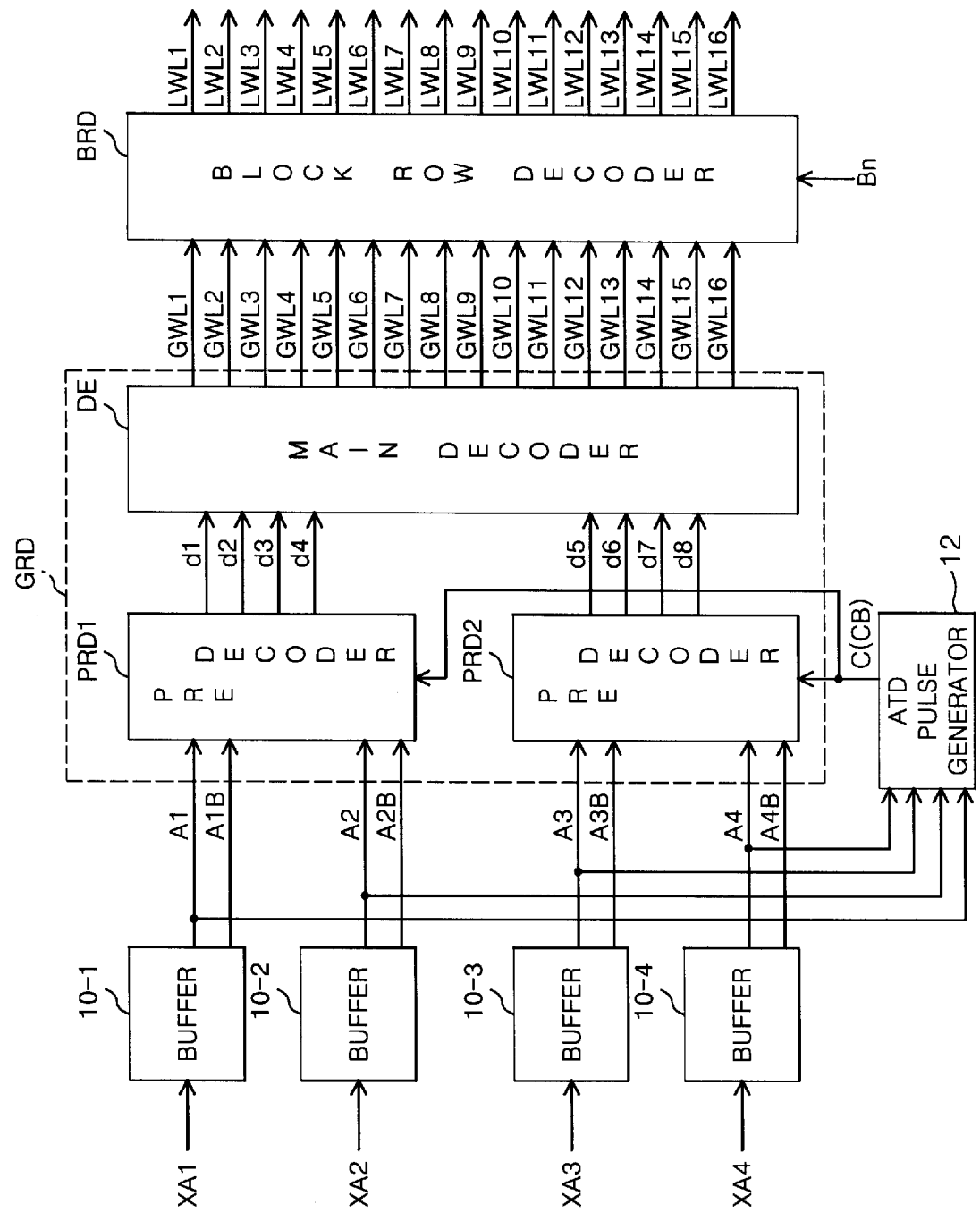
FIG. 8 is a block diagram for illustrating another embodiment of a decoder of a semiconductor memory device of the present invention.

FIG. 8 is a block diagram illustrating another embodiment of the decoder of the semiconductor memory device of the present invention, additionally including the address transition detecting pulse generator 12 along with the structure of the conventional decoder, wherein the pulse signal (C or CB) generated by the address transition detecting pulse generator 12 is transmitted to the pre-decoders PRD1, PRD2 to generate a decoding output signal for the duration of a pulse signal (C or CB).

Figure 9:
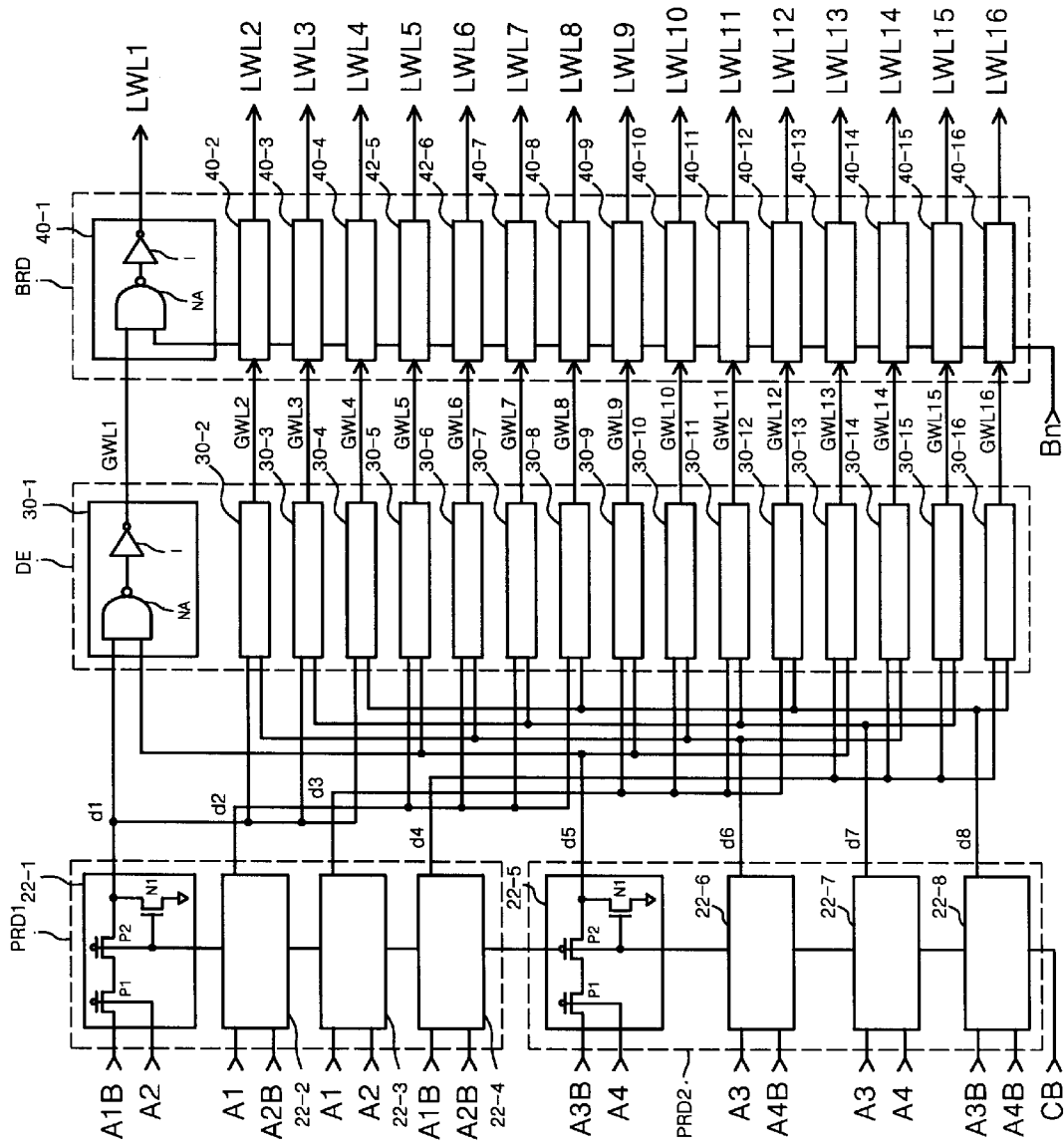
FIG. 9 is a circuit diagram for illustrating an embodiment of the block diagram shown in FIG. 8.

FIG. 9 is a circuit diagram illustrating an embodiment of the block diagram shown in FIG. 8. The pre-decoders PRD1, PRD2 have the same structure as shown in FIG. 6. The main decoder DE and the block row decoder BRD are constructed in the same structure as in the conventional ones of FIG. 3.

The structure and operations of the main decoder DE and the block row decoder BRD will be easily understood with reference to descriptions of FIG. 3. The structure and operations of the pre-decoders PRD1, PRD2 will also be easily understood with reference to descriptions of FIG. 6.

Therefore, the decoder shown in FIG. 9 performs such operations as in the Table above.

Figure 10:
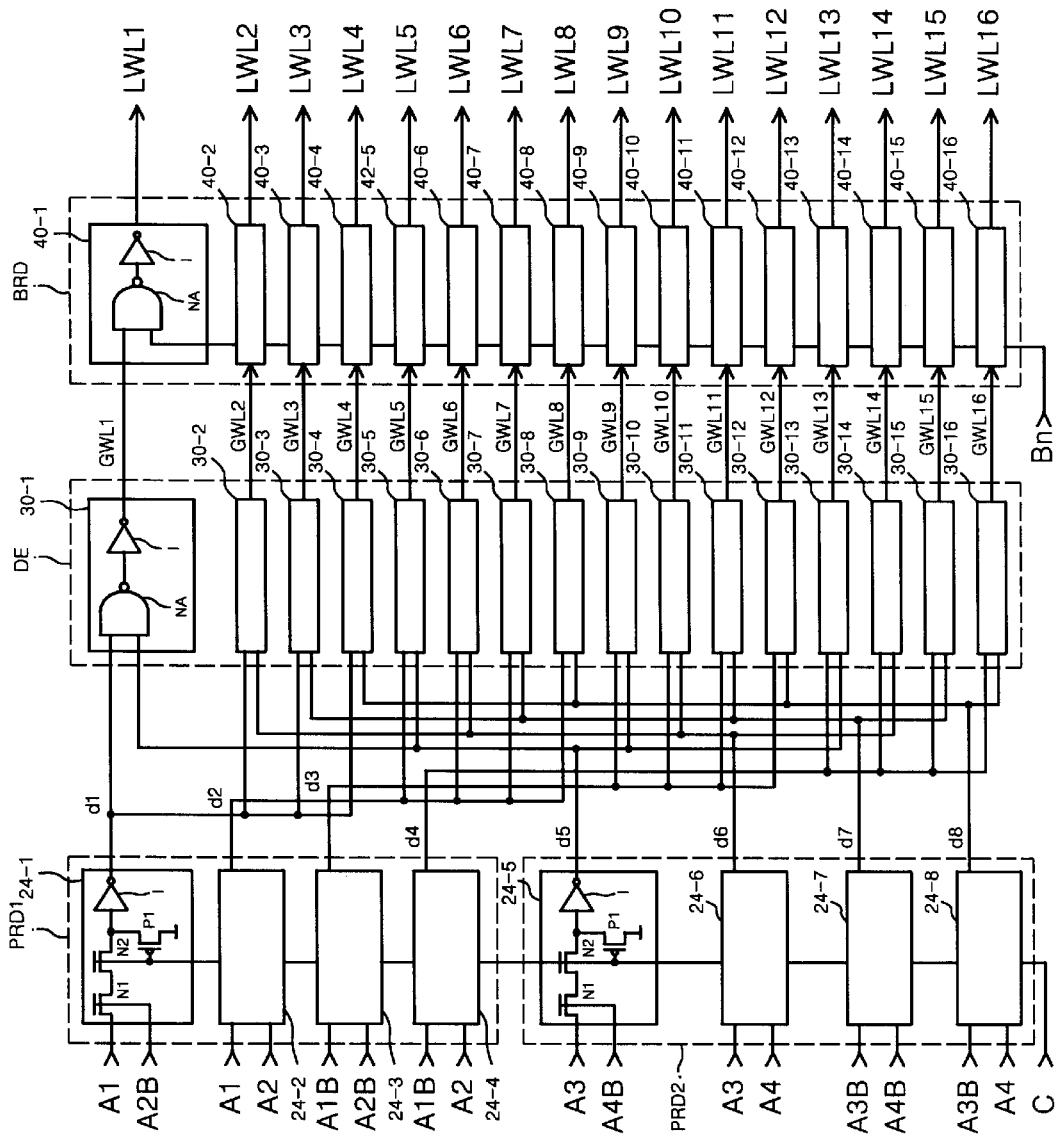
FIG. 10 is a circuit diagram for illustrating another embodiment of the block diagram shown in FIG. 8.

FIG. 10 is a circuit diagram illustrating another embodiment of the block diagram shown in FIG. 8. The pre-decoders PRD1, PRD2 are constructed in the same structure as shown in FIG. 7. The main decoder DE and the block row decoder BRD are constructed in the same structure as the conventional ones of FIG. 3.

The structure and operations of the main decoder and the block row decoder BRD will be easily understood with reference to the descriptions of FIG. 3. The structure and operations of the pre-decoders PRD1, PRD2 will also be easily understood with reference to descriptions of FIG. 7.

Therefore, the decoder shown in FIG. 10 performs such operations as in the Table above.

The decoders shown in FIGS. 9 and 10 may be seen to reduce the total number of transistors, like those shown in FIGS. 5 through 7, but do not reduce the number of transistors within block row decoders BRD.

Figure 11:
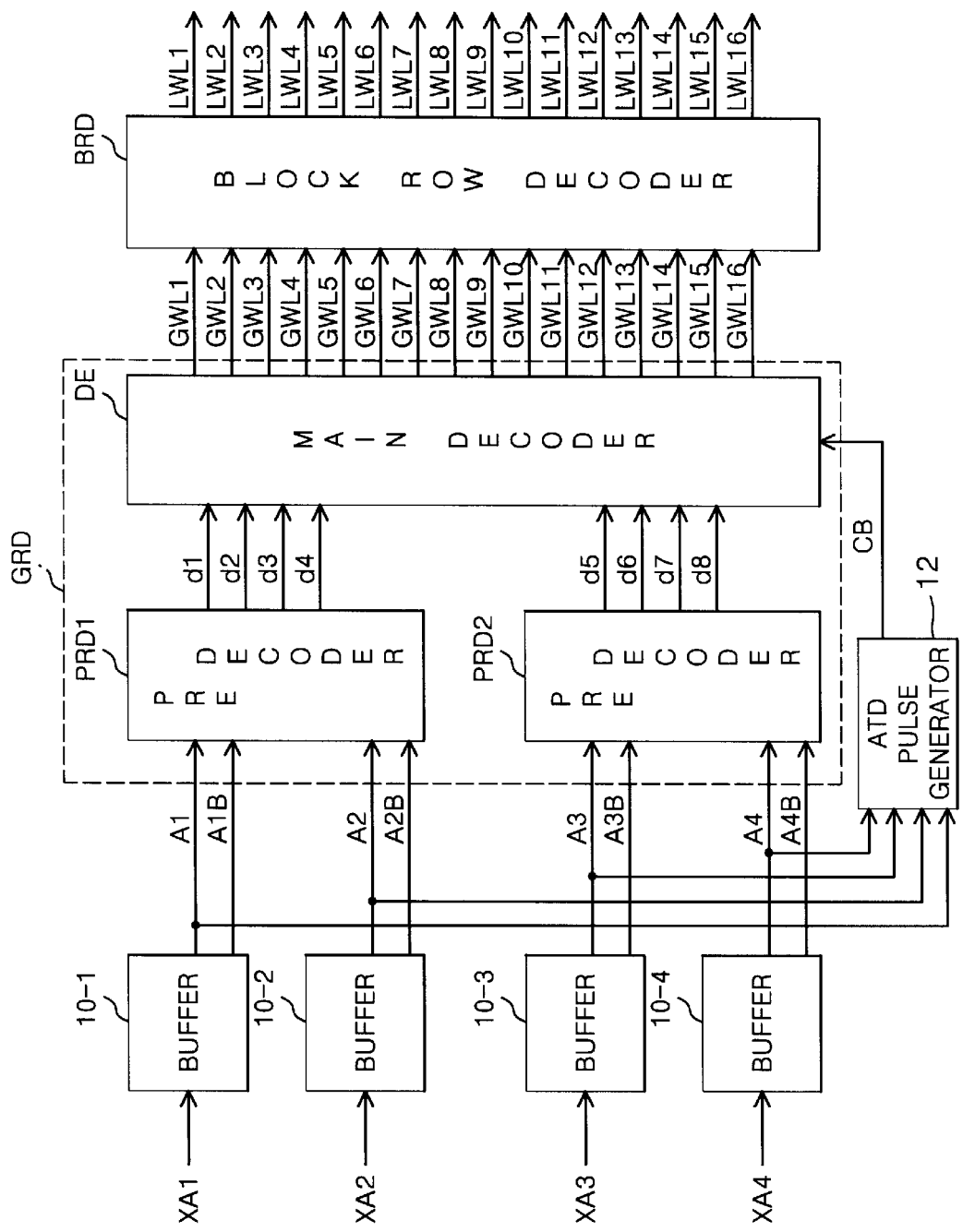
FIG. 11 is a block diagram for illustrating a third embodiment of a decoder of a semiconductor memory device of the present invention.

FIG. 11 is a block diagram illustrating another embodiment of the decoder of the semiconductor memory device of the present invention, additionally including an address transition detecting pulse generator 12 along with the structure of the conventional decoder. The pulse signal (CB) generated by the address transition detecting pulse generator 12 is applied to the main decoder DE, thereby generating decoding output signals GWL1, GWL2, ... GWL16 for the duration of the pulse signal.

Figure 12:
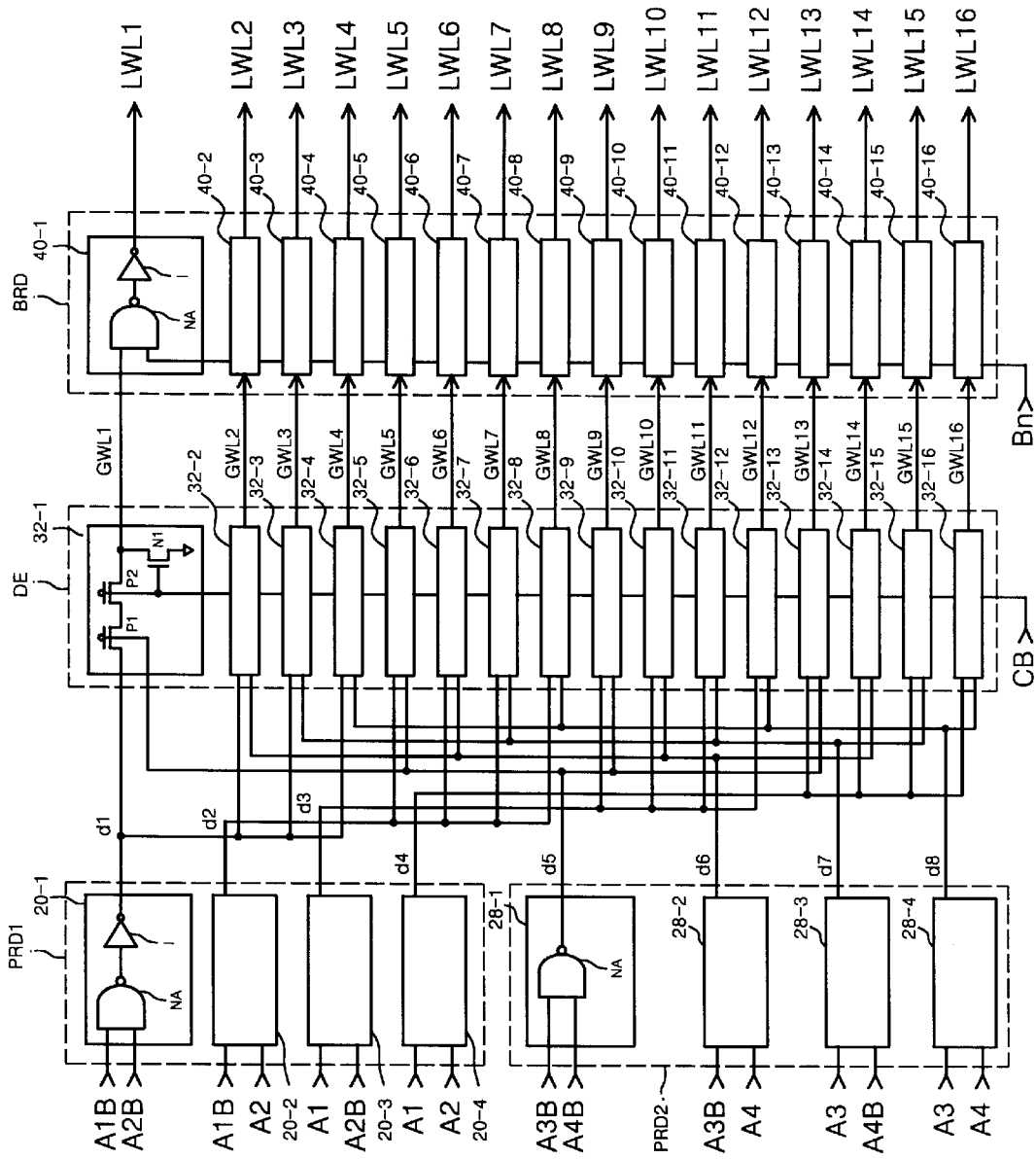
FIG. 12 is a circuit diagram for illustrating an embodiment of the block diagram shown in FIG. 11.

FIG. 12 is a circuit diagram illustrating an embodiment of the block diagram shown in FIG. 11. The structure of the pre-decoders PRD1, PRD2 and the block row decoder BRD is the same as that of the conventional ones shown in FIG. 3. The main decoder DE is constructed with decoding cells 30-1, 30-2, ..., 30-16, the structure of which is the same as that of each decoding cell of the pre-decoders PRD1, PRD2 of FIG. 6.

The structure and operations of the pre-decoders PRD1, PRD2 and the block row decoder BRD will be easily understood with reference to descriptions of FIG. 3. The structure and operations of the main decoder DE will also be easily understood with reference to descriptions of FIG. 6 regarding PRD1, PRD2.

Therefore, the decoder shown in FIG. 12 performs such operations as in the Table above.

Furthermore, the decoding cells of the main decoder DE shown in FIG. 12 are identical with those of the pre-decoders PRD1, PRD2, and the same operations as in the Table above can be performed.

The decoder shown in FIG. 12 succeeds in reducing the total number of transistors as the structure of the decoder shown in FIGS. 5 through 7, but does not reduce the number of transistors within the block row decoder BRD.

Therefore, the total number of transistors to make up of decoders is reduced in the semiconductor memory device of the present invention, to thereby improve layout efficiency.

Particularly, in the semiconductor memory device shown in FIGS. 5 through 7, the number of transistors that make up the block row decoder positioned between blocks of the memory cell arrays is reduced to increase the number of the word lines in the blocks of the memory cell arrays and to enable the layout of the block row decoder in spite of reduction in the area between blocks.

Furthermore, the aforementioned embodiment is constructed to generate 16 global word line signals by sequentially inputting four addresses, pre-decoding pairs of addresses and decoding the signals pre-decoded by the main decoder.

However, another embodiment can be constructed to generate 16 global word line signals by pre-decoding 3 addresses and decoding the signal pre-decoded by the main decoder and one address.

Figure 13:
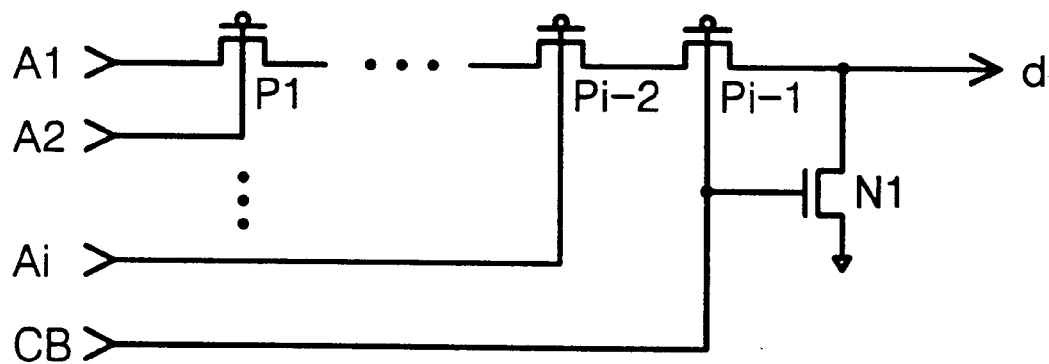
FIG. 13 is a circuit diagram for illustrating decoding cells of a generalized decoder of a semiconductor memory device in accordance with an embodiment of the present invention.

FIG. 13 is a circuit diagram for illustrating a generalized embodiment of decoding cells of the decoder in the semiconductor memory cell of the present invention, comprising i−1 PMOS transistors P1, ..., Pi−2, Pi−1 chain-connected between the address A1 and the decoding output signal (d) generating terminal having gates where i−1 addresses A2, ..., Ai and an inverted pulse signal (CB) are respectively applied, and one NMOS transistor N1 having a drain connected to the decoding output signal (d) generating terminal, a gate where an inverted pulse signal (CB) is applied and a source where a grounding voltage is applied.

Figure 14:
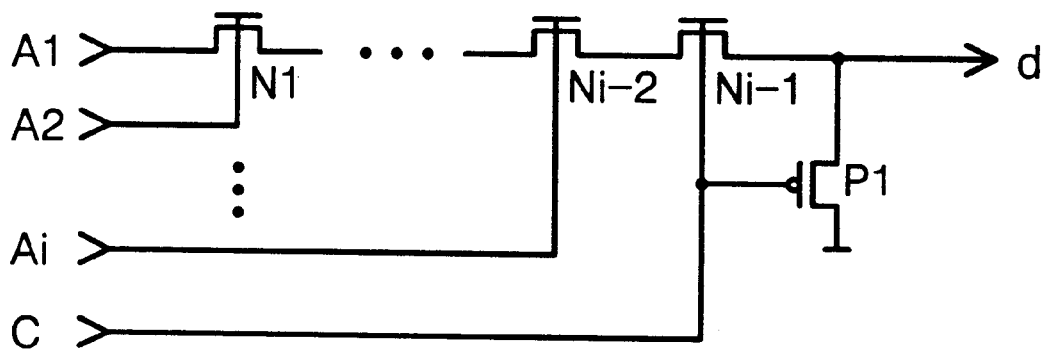
FIG. 14 is a circuit diagram for illustrating decoding cells of another generalized decoder of a semiconductor memory device in accordance with another embodiment of the present invention.

FIG. 14 is a circuit diagram for illustrating another generalized embodiment of decoding cells of the decoder of the semiconductor memory device of the present invention, comprising i−1 NMOS transistors N1, ..., Ni−2, Ni−1 chain-connected between the address A1 and the decoding output signal (d) generating terminal having gates where i−1 addresses A2, ..., Ai and a pulse signal (C) are respectively applied, and one PMOS transistor P1 having a drain connected to the decoding output signal (d) generating terminal, a gate where a pulse signal (C) is applied and a source where a supply voltage is applied.

In other words, the decoding cells shown in FIGS. 13 and 14 are useful in decoding more than 3 addresses. It is possible therefore to further reduce the number of transistors within the pre-decoders for the global row decoder.

Furthermore, if the number of addresses to be inputted increases, the decoder should be constructed with a predetermined groups of pre-decoders because it is more difficult to construct the decoder with one group of pre-decoders.

The decoder can be constructed to generate decoding output signals by mixing the pulse signals generated by the address transition detecting unit in at least one group of pre-decoders out of a predetermined groups of pre-decoders. The decoding cells of the pre-decoders, where the pulse signals are mixed, are constructed in the same structure as the decoding cell 22-1 or the decoding cell 24-1.

Therefore, the decoder of the semiconductor memory device of the present invention is constructed to generate the decoding output signals to the global row decoder or the block row decoder during the period of the pulse generated by the address transition detecting pulse generator, so that the number of transistors of the global row decoder or block row decoder is greatly reduced for more efficient layout.

In addition, the decoder of the semiconductor memory device of the present invention can be also applied as a general decoder.

While the decoder of the semiconductor memory device of the present invention has been described in terms of preferred embodiments, those skilled in the art will recognize that the invention can be practiced with modification within the spirit and scope of the appended claims.

There are advantages in the semiconductor memory device of the present invention in that the total number of transistors to make up of the decoder and the number of transistors for the block row decoder positioned between blocks of memory cell arrays can be reduced for efficient layout.

What is claimed is:

1. A semiconductor memory device comprising:
   a plurality of memory cell array blocks;
   an address transition detecting pulse generator to generate address transition detecting pulse signals by detecting the transition of a plurality of addresses;
   a global row decoder having a plurality of groups of pre-decoders and a main decoder to generate a plurality of global word line signals of a plurality of memory cell array blocks by decoding the plurality of addresses; and
   a plurality of block row decoders having a plurality of decoding cells to respectively respond to block controls signal to respectively select a plurality of memory cell array blocks and a plurality of pulse control signals combined with the address transition detecting pulse signals to output a plurality of global word line signals generated by the global row decoder as a plurality of local word line signals, wherein a plurality of the decoding cells of a plurality of the block row decoders comprises:
      switching means to switch the global word line signal into a local word line signal in response to the first state of the pulse control signals; and
      inactive means to put the local word line signal into its inactive state in response to the second state of the pulse control signals.

2. The device, as defined in claim 1, wherein the inactive means is constructed with a PMOS transistor which comprises:
   a source connected to the global word line;
   a gate where the block control signal is applied; and
   a drain connected to the local word line.

3. The device, as defined in claim 1, wherein the inactive means is constructed with a NMOS transistor which comprises:
   a drain connected to the local word line;
   a gate where the block control signal is applied; and
   a source connected to grounding voltage.

4. The device, as defined in claim 1, wherein a plurality of groups of the pre-decoders are constructed with a plurality of decoding cells.

5. The device, as defined in claim 1, wherein the main decoder is constructed with a plurality of decoding cells.

6. The device, as defined in claim 5, wherein at least one group of a plurality of decoding cells out of a plurality of groups of the pre-decoders and the main decoders comprises:
   a plurality of switching means respectively chain-connected between an input terminal to input one decoding output signal of a prior group of pre-decoders and a decoding output signal generating terminal, having control electrodes to respectively input other decoding output signals of the prior group of pre-decoders and the address transition detecting pulse signals; and
   inactive means connected to the decoding output signal generating terminal to put the decoding output signal generating terminal into its inactive state in response to the address transition detecting pulse signals.

7. The device, as defined in claim 6, wherein a plurality of the switching means are constructed with a PMOS transistor.

8. The device, as defined in claim 6, wherein the inactive means is constructed with an NMOS transistor.

9. A semiconductor memory device comprising:
   a plurality of memory cell array blocks;
   an address transition detecting pulse generator to generate address transition detecting pulse signals by respectively detecting the transition of a plurality of addresses;
   a global row decoder having a plurality of groups of pre-decoders and a main decoder with a plurality of decoding cells to generate a plurality of global word line signals to control a plurality of control word lines of a plurality of memory cell array blocks by decoding of the plurality of addresses and responding to the address transition detecting pulse signals; and
   a plurality of block row decoders respectively having a plurality of decoding cells to respectively respond to the block control signals to respectively select a plurality of memory cell array blocks to output a plurality of global word line signals generated by the global row decoder as a plurality of local word line signals, wherein a plurality of decoding cells of a plurality of groups of the pre-decoders and the main decoder of the global row decoders comprises:
      a plurality of switching transistors chain-connected between an input terminal to input one decoding output signal of a prior group of pre-decoders and a decoding output signal generating terminal having control electrodes to respectively input the other decoding output signals of the prior group of pre-decoders and the address transition detecting pulse signals; and
      inactive means connected to the decoding output signal generating terminal to put the decoding output signal generating terminal into its inactive state in response to the address transition detecting pulse signals.

10. The device, as defined in claim 9, wherein a plurality of the switching transistors are PMOS.

11. The device, as defined in claim 9, wherein the inactive means is constructed with an NMOS transistor.

12. A decoder of a semiconductor memory device comprising:
   an address transition detecting pulse signal generating unit to generate address transition detecting pulse signals by detecting the transition of a plurality of input signals; and
   a decoder having a plurality of groups of pre-decoders and a main decoder with a plurality of decoding cells to generate a plurality of decoding output signals by decoding the plurality of input signals and responding to the address transition detecting pulse signals, wherein a plurality of decoding cells of at least one group of the pre-decoders out of a plurality of groups of pre-decoders comprise:

a plurality of switching means respectively connected with an input terminal to input decoding output signals of a prior group of the pre-decoders and a decoding output generating terminal, having control electrodes to input other decoding output signals of the prior group of pre-decoders and the address transition detecting pulse signals; and inactive means connected to the decoding output signal generating terminal to put the decoding output signal generating terminal into its inactive state in response to the address transition detecting pulse signals.

13. The decoder, as defined in claim 12, wherein a plurality of the switching means are constructed with PMOS transistors.

14. The decoder, as defined in claim 12, wherein a plurality of the inactive means are constructed with an NMOS transistor.

* * * * *

UNITED STATES PATENT AND TRADEMARK OFFICE
CERTIFICATE OF CORRECTION

PATENT NO.    : 6,256,254 B1
DATED         : July 3, 2001
INVENTOR(S)   : Choong-Keun Kwak and Sang-Jib Han It is certified that error appears in the above-identified patent and that said Letters Patent is hereby corrected as shown below:

<u>Title page,</u>
ABSTRACT,
Line 1, "includes" should read -- comprises --;

<u>Column 2,</u>
Line 44, "(d4, d7 pre-decoders" should read -- (d4, d7), (d4, d8) of the pre-decoders --;

<u>Column 7,</u>
Line 10, insert -- (A1, A2) -- after "(A1, A2B),".

Signed and Sealed this

Twentieth Day of August, 2002

*Attest:*

*Attesting Officer*

JAMES E. ROGAN
*Director of the United States Patent and Trademark Office*